(12) United States Patent
Inagaki et al.

(10) Patent No.: US 7,255,749 B2
(45) Date of Patent: Aug. 14, 2007

(54) SUBSTRATE CLEANING METHOD AND SUBSTRATE CLEANING APPARATUS

(75) Inventors: Yasuhito Inagaki, Kanagawa (JP); Mineo Shimizu, Kanagawa (JP); Yoshihiro Fujitani, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/937,014

(22) Filed: Sep. 9, 2004

(65) Prior Publication Data

US 2005/0022845 A1 Feb. 3, 2005

Related U.S. Application Data

(62) Division of application No. 09/905,662, filed on Jul. 13, 2001.

(30) Foreign Application Priority Data

Jul. 14, 2000 (JP) .......................... P2000-214974
Aug. 8, 2000 (JP) .......................... P2000-240134

(51) Int. Cl.
*B08B 7/04* (2006.01)

(52) U.S. Cl. ................ 134/18; 134/2; 134/3; 134/25.4; 134/42; 436/50; 438/906

(58) Field of Classification Search .................... 134/2, 134/3, 18, 25.4, 42; 436/50; 438/906
See application file for complete search history.

(56) References Cited

U.S. PATENT DOCUMENTS 3,434,896 A 3/1969 Dudley
3,705,061 A * 12/1972 King ........................... 216/93
5,472,516 A 12/1995 Hanson et al. ................ 134/18
5,571,375 A * 11/1996 Izumi et al. ................. 438/743
5,722,441 A 3/1998 Teramoto (Continued)

FOREIGN PATENT DOCUMENTS

JP 59-046032 3/1984

(Continued)

OTHER PUBLICATIONS

Kashkoush et al., "In-Situ Chemical Concentration Control for Wafer Wet Cleaning," Journal of the IEST, May/Jun. 1998, pp. 24-30.

*Primary Examiner*—M. Kornakov
(74) *Attorney, Agent, or Firm*—Sonnenschein Nath & Rosenthal LLP

(57) ABSTRACT

In a cleaning treatment of a substrate using an aqueous solution of ammonium fluoride or a mixture of an aqueous solution of ammonium fluoride and hydrofluoric acid as a cleaning liquid, the cleaning liquid is replenished by at least one liquid selected from the group consisting of water, ammonia, aqueous ammonia, and an aqueous solution of ammonium fluoride with the lapse of time during the use of the cleaning liquid, in which the required amount of the liquid to be added according to the time lapse is calculated based on the measurement date and controlled, or the component concentration of the cleaning liquid is detected and the liquid is added according to the obtained result, so that not only can the substrate be cleaned uniformly and stably, but also a resource saving and a reduction in waste can be achieved.

8 Claims, 7 Drawing Sheets

U.S. PATENT DOCUMENTS

| | | |
|---|---|---|
| 5,903,006 A | 5/1999 | Kiuchi et al. |
| 5,976,988 A | 11/1999 | Konuma et al. |
| 6,092,539 A | 7/2000 | Chang et al. ............. 134/57 R |
| 6,261,845 B1 | 7/2001 | Verhaverbeke et al. ....... 436/55 |
| 6,350,425 B2 | 2/2002 | Hoffman et al. |
| 6,391,145 B1 | 5/2002 | Nishimoto et al. |
| 6,497,238 B1 * | 12/2002 | Knotter ...................... 134/1.3 |
| 6,589,884 B1 * | 7/2003 | Torek .......................... 438/755 |
| 6,767,877 B2 * | 7/2004 | Kuo et al. .................. 510/175 |

FOREIGN PATENT DOCUMENTS

| | | |
|---|---|---|
| JP | 60-114579 | 6/1985 |
| JP | 8-334461 | 12/1996 |
| JP | 9-22891 | 1/1997 |
| JP | 2000150447 | 5/2000 |
| WO | WO 98/56726 | 12/1998 |

* cited by examiner

SUBSTRATE CLEANING METHOD AND SUBSTRATE CLEANING APPARATUS

CROSS REFERENCES TO RELATED APPLICATIONS

This is a divisional of co-pending U.S. application Ser. No. 09/905,662, filed on Jul. 13, 2001, which claims priority to Japanese Patent Applications JP 2000-214974, filed on Jul. 14, 2000, and JP 2000-240134, filed on Aug. 8, 2000, all of which are incorporated herein by reference.

BACKGROUND OF THE INVENTION

1. Field of the Invention

The present invention relates to a substrate cleaning method and a substrate cleaning apparatus for cleaning a substrate, which use, as a cleaning liquid, an aqueous solution of ammonium fluoride or a mixture of an aqueous solution of ammonium fluoride and hydrofluoric acid. More particularly, the present invention is concerned with a novel substrate cleaning method and a novel substrate cleaning apparatus, which are developed for achieving both uniform and stable cleaning treatment and reduction in the amount of the cleaning liquid used.

2. Description of the Related Art

An aqueous solution of ammonium fluoride (including arbitrary mixtures of hydrofluoric acid and ammonia, and ones containing a surfactant) is widely used in the form of a mixture thereof with hydrofluoric acid and the like for cleaning or etching a semiconductor (mainly a silicon oxide film) substrate or a glass substrate in the production process for semiconductor or liquid crystal display (LCD).

In addition to the above example of substrate cleaning, in Unexamined Japanese Patent Application Laid-Open Specification No. 2000-150447, a mixture of ammonia and hydrogen peroxide is used for cleaning silicon wafers. This prior art document discloses that the ammonia concentration and hydrogen peroxide concentration of the mixture are individually monitored during the cleaning, and the change with time of the chemical liquid concentration is accurately estimated based on the results of measurements to calculate and adjust the amount of the chemical liquid to be added, so that the chemical liquid concentration is kept constant.

In these fields, for achieving reduction in weight and downsizing of products and the lowering of consumed electric power, development of a microfabrication technology for a higher integration degree is desired.

In any case of cleaning substrates using, as a cleaning liquid, for example, an aqueous solution of ammonium fluoride, a mixture of an aqueous solution of ammonium fluoride and hydrofluoric acid as mentioned above, or other chemical liquids, a higher accuracy treatment is desired.

By the way, in the above-mentioned cleaning or etching, the chemical component content, such as ammonium fluoride ($NH_4F$), and hydrogen fluoride (HF), and moisture content of the cleaning liquid change (evaporate) with the lapse of time. Therefore, such cleaning or etching has a problem in that the etching rate for a silicon oxide film or a glass substrate changes (increases).

This is caused by the gradual increase in the hydrofluoric acid component concentration of the cleaning liquid with the lapse of time during the use of the cleaning liquid, and the problem of the change in the concentrations of the components in the cleaning liquid has been conventionally solved by frequently replacing the cleaning liquid.

However, in this method, a great amount of the cleaning liquid is required. Especially a cleaning liquid containing ammonium fluoride is used in an ammonium fluoride concentration as high as several tens % (for example, about 40% by weight), and hence, the amount of the chemical consumed per liquid replacement in this cleaning liquid is large, as compared to those in other cleaning liquids generally used in a chemical concentration of about several %. Accordingly, the amounts of the ammonium fluoride and hydrofluoric acid used (cost for chemicals) are to increase.

Further, after the cleaning liquid is used, a waste water treatment shown in FIG. 1 is needed, and, in this treatment, a large amount of resource (waste water treatment agent) is consumed, resulting in a large amount of waste products (waste water and sludge)(see FIG. 2).

FIG. 1 is an explanatory view illustrating a process for treating the effluent of a cleaning liquid. Effluent produced in a cleaning bath 11 is transferred to a pH-adjusting bath 12, and neutralized in this bath by, for example, a 20% aqueous solution of calcium hydroxide. Next, the effluent is transferred to a coagulo-sedimentation bath 13 and subjected to coagulation and sedimentation by a chemical, such as aluminum sulfate, and then, in a flocculation bath 14, is flocculated by a polymeric flocculent, such as a polyacrylamide flocculent, and subjected to sedimentation, followed by discharge in the form of sewage and sludge.

In the above treatment process, as shown in FIG. 2, for treating 1 kg of a 40% aqueous solution of ammonium fluoride, 2.0 kg of 20% calcium hydroxide, 0.3 kg of 8% aluminum sulfate, and 1.6 kg of a polymeric flocculant are required, so that 2.6 kg of sludge having a solids content of 70% and 2.3 kg of sewage waste water are produced.

In recent years, concern about the environmental problems is growing worldwide, and a demand for removing the environmental burden caused by the production of substrates for semiconductor and LCD is being increasing. Therefore, with respect to the cleaning liquid for the substrates, not only for reducing the cost, but also for achieving preservation of the environment, i.e., a saving of resource, a reduction in waste, and environmental cleaning, a solution of the problem about the reduction in the amount of the cleaning liquid used is socially desired strongly.

SUMMARY OF THE INVENTION

According to the present invention, there is provided a substrate cleaning method and a substrate cleaning apparatus which enable a resource saving and a reduction in waste to be achieved.

The present invention also provides a substrate cleaning method which is developed for achieving both the uniform and stable cleaning treatment and the reduction in the amount of the cleaning liquid used.

Furthermore, the present invention provides a substrate cleaning apparatus which is developed for achieving both uniform and stable cleaning treatment and reduction in the amount of the cleaning liquid used.

Still furthermore, a substrate cleaning method and a substrate cleaning apparatus, which use an aqueous solution of ammonium fluoride or a mixture of an aqueous solution of ammonium fluoride and hydrofluoric acid as a cleaning liquid is also provided according to the present invention.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which.

DETAILED DESCRIPTION OF THE PREFERRED EMBODIMENTS

Hereinbelow, a substrate cleaning method and a substrate cleaning apparatus according to the present invention will be described in detail with reference to the accompanying drawings.

In the present invention, in the cleaning (or etching) treatment of a substrate using, as a treatment liquid (or a cleaning liquid), an aqueous solution of ammonium fluoride or a mixture of an aqueous solution of ammonium fluoride and hydrofluoric acid, the cleaning liquid is replenished by at least one liquid selected from the group consisting of water, ammonia, aqueous ammonia, and an aqueous solution of ammonium fluoride according to the accumulative time for using the cleaning liquid and the individual component concentrations of the cleaning liquid.

Figure 1:
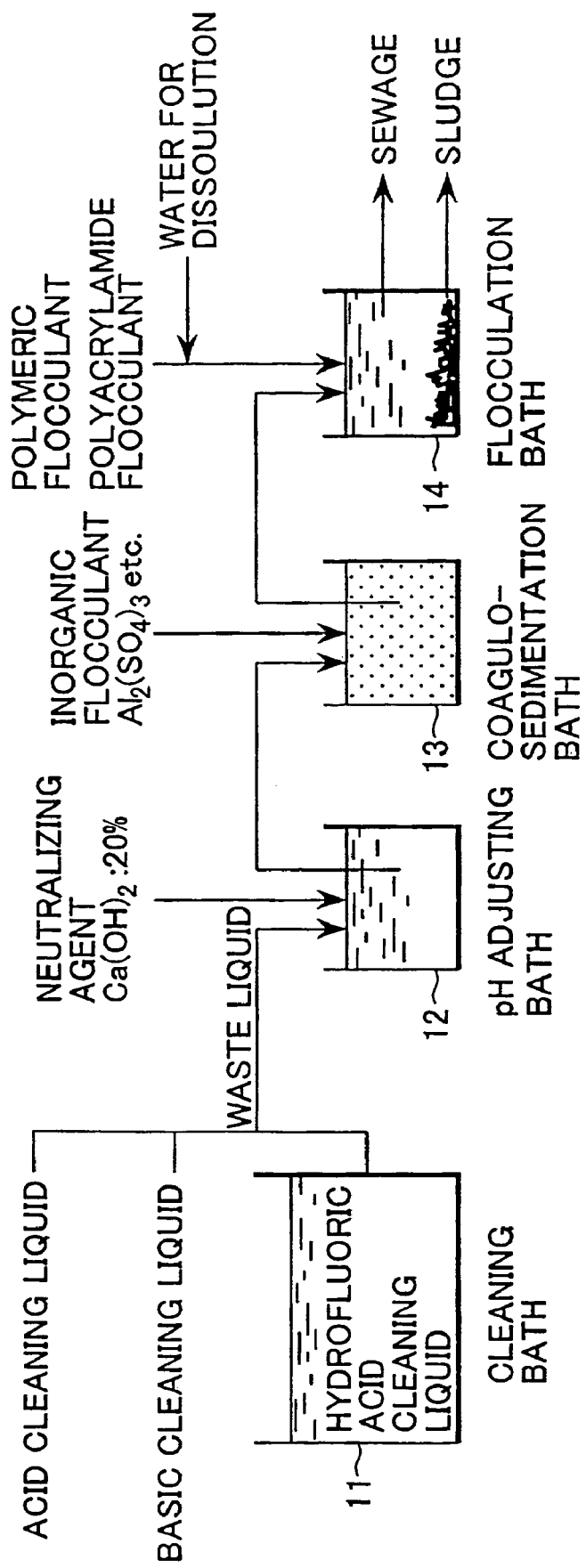
FIG. 1 is an explanatory view illustrating a process for treating an effluent of a cleaning liquid, which is the related art.
Figure 2:
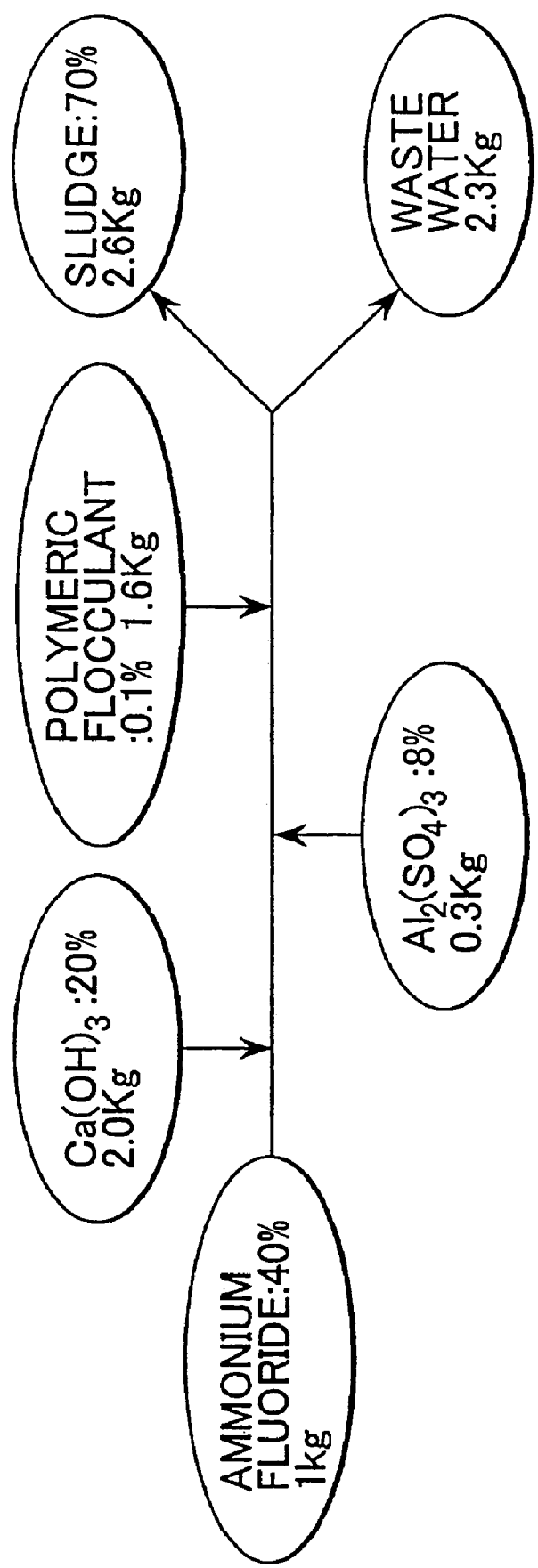
FIG. 2 is a diagram showing a resource (chemicals) required for an effluent treatment for a cleaning liquid, which is the related art.
Figure 3:
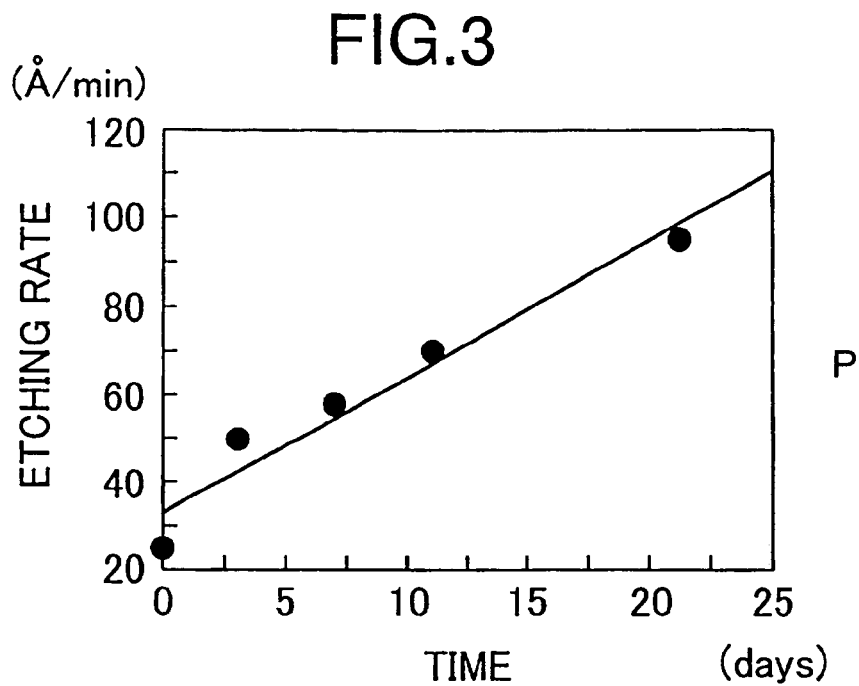
FIG. 3 is a graph showing the relationship between time and etching rate with respect to the cleaning liquid.

FIG. 3 shows the relationship between the lapse of time and the etching rate for a thermal oxide film with respect to the mixture of ammonium fluoride and hydrofluoric acid. The cleaning liquid has a composition such that the $NH_4F$ (40%):HF (50%) ratio is 400:1, and the temperature of the cleaning liquid is 25° C. and the thermal oxide film is comprised of $SiO_2$.

In the graph shown in FIG. 3, the time is taken as the abscissa and represented by a unit of "days", and the etching rate for a substrate is taken as the ordinate and represented by a unit of the etching rate per minute, i.e., "Å/min". The etching rate changes with time as follows: after a lapse of 0 day, the etching rate is about 34 Å/min; after a lapse of 11 days, the etching rate is 70 Å/min; and after a lapse of 22 days, the etching rate is 95 Å/min.

As can be seen from FIG. 3, the etching rate for the thermal oxide film remarkably increases with the lapse of time.

As mentioned above, in the cleaning treatment of a substrate using the above-mentioned cleaning liquid, the etching rate changes with time, and there is a very good correlation (proportionality relation) between the etching rate and the time. This means that the moisture content and chemical component (such as ammonium fluoride ($NH_4F$) and hydrogen fluoride (HF)) contents of the cleaning liquid change (evaporate) with the lapse of time, and specifically means that the water component and ammonia component of the cleaning liquid evaporate at a constant rate, so that the concentration of the hydrogen fluoride (HF) component (which directly contributes to the etching for the thermal oxide film) in the cleaning liquid increases at a constant rate.

Figure 4:
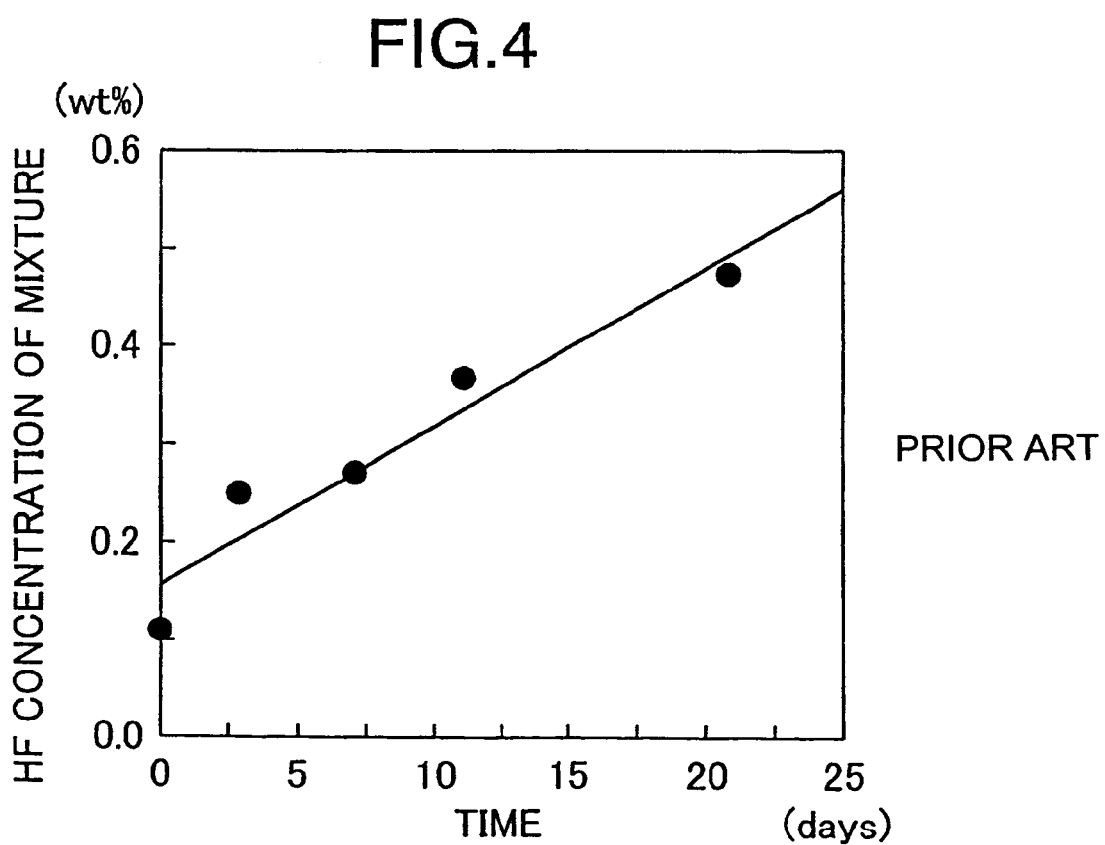
FIG. 4 is a graph showing the relationship between the time and the HF concentration of the cleaning liquid.

FIG. 4 shows the change in the HF concentration of the cleaning liquid with the lapse of time.

The time is taken as the abscissa and represented by a unit of "days", and ranges from 0 to 25 days. On the other hand, the HF concentration of the mixture is taken as the ordinate and represented by a unit of "% by weight (wt %)", and ranges from 0 to 0.6 wt % and is shown in a scale of 0.1 wt %.

After a lapse of 0 day, the HF concentration is 0.1 wt %; after a lapse of 11 days, the HF concentration is 0.35 wt %; and after a lapse of 22 days, the HF concentration is 4.7 wt %.

From the above, it is found that the HF concentration of the mixture increases at a constant rate with the lapse of time.

Thus, in the cleaning (etching) treatment of a substrate using an aqueous solution of ammonium fluoride or a mixture of an aqueous solution of ammonium fluoride and hydrofluoric acid, the HF concentration of the cleaning liquid is required to be kept constant. In this case, a most effective method is the one in which water that readily evaporates from the cleaning liquid is appropriately added to the cleaning liquid.

Specifically, when water is added to the cleaning liquid with the lapse of time, a rise in the HF concentration can be suppressed, so that the etching rate can be kept constant. Also when an aqueous solution of ammonium fluoride is added to the cleaning liquid, the HF concentration is lowered, so that a similar effect can be expected.

On the other hand, when ammonia is added to the cleaning liquid, HF in the cleaning liquid is neutralized by ammonia to form ammonium fluoride, so that a rise in the HF concentration of the cleaning liquid can be suppressed. When aqueous ammonia is added, both the dilution effect and the neutralization effect can be expected.

By the above-mentioned method, not only can the yield of substrates for semiconductor and liquid crystal be improved, but also the frequency of the liquid replacement can be reduced, thus making it possible to achieve both the saving of chemicals, such as the cleaning liquid and waste water treatment agent, and the reduction in sludge and waste water amount.

Figure 5:
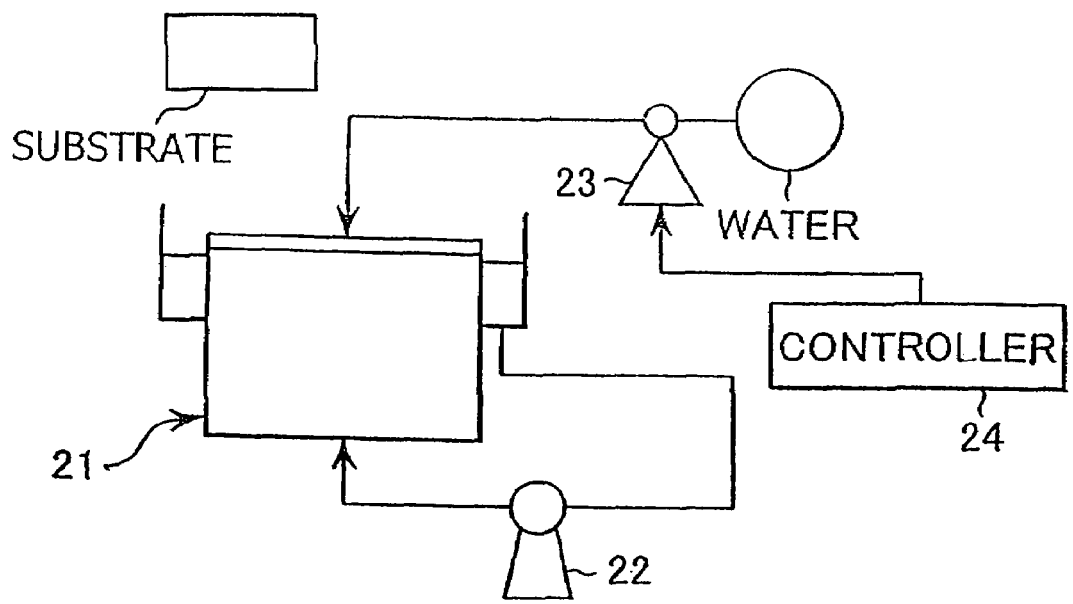
FIG. 5 is a diagrammatic view showing an example of a substrate cleaning apparatus, which is a first embodiment of the present invention.

FIG. 5 shows an example of the construction of the substrate cleaning apparatus according to the present invention.

This substrate cleaning apparatus comprises a substrate treatment bath 21 for storing therein a cleaning liquid comprising, for example, a mixture of ammonium fluoride and hydrofluoric acid, and for subjecting a substrate to cleaning treatment, and a circulation pump 22 for circulating the cleaning liquid which is the overflow back to the substrate treatment bath 21. For example, a substrate, which is a substance to be treated, is accommodated in a substrate carrier and dipped in the cleaning liquid in the substrate treatment bath 21, and thus performing a cleaning (etching) treatment.

The characteristic feature of the above apparatus resides in that the substrate treatment bath 21 is provided with a constant delivery pump 23 and a controller 24, by which feeding water and addition of water through the pump 23 is controlled.

As mentioned above, the HF component concentration of the cleaning liquid increases with the lapse of time at a constant rate, so that the etching rate for the thermal oxide film remarkably increases.

Therefore, in this substrate cleaning apparatus, the HF concentration is controlled by the controller 24 so as to be kept constant by adding water to the substrate treatment bath 21 with the lapse of time by means of the constant delivery pump 23 so that the etching rate is kept substantially constant.

Figure 6:
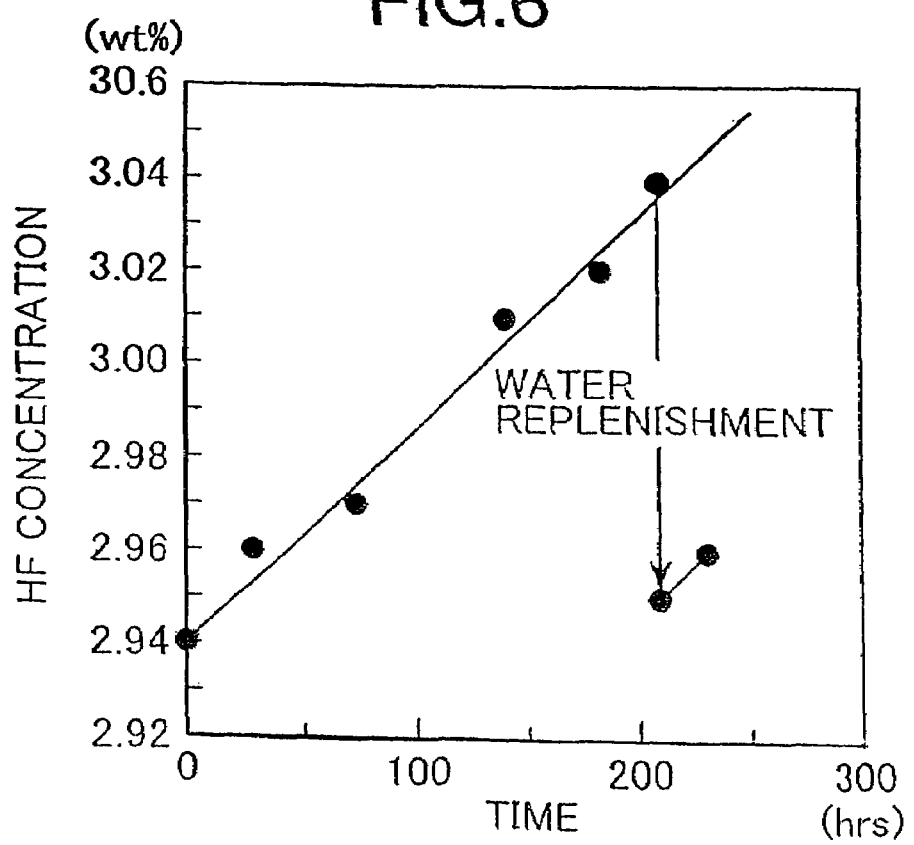
FIG. 6 is a graph showing the change in the HF concentration by addition of water according to the present invention.

FIG. 6 shows the change in the HF concentration when water is added. In this graph, the time is taken as the abscissa and represented by a unit of "hours (hrs)", and ranges from 0 to 300 hrs. On the other hand, the HF concentration is taken as the ordinate and represented by a unit of "wt %", and ranges from 2.92 to 3.06 wt %. After a lapse of 0 hr, the HF concentration is 2.94 wt %; and after a lapse of 220 hrs, the HF concentration is 3.04 wt %. When water is added at this point in time, the HF concentration is lowered to 2.95 wt %. After a lapse of further about 20 hrs, the HF concentration slightly increases to 2.96 wt %.

As apparent from the above description, the HF concentration which increases with the lapse of time goes back to the original concentration by addition of water. The control of the HF concentration by addition of water leads to the control of the etching rate, and, as shown in FIG. 7, the etching rate is also lowered by the addition of water.

With respect to the amount of the water added and the timing of the water addition, data is obtained as shown in FIG. 3 and FIG. 4 to calculate the amount of the water which evaporates with the lapse of time, making it possible to introduce the optimal amount of the water added and the optimal conditions for the timing of the water addition.

Figure 7:
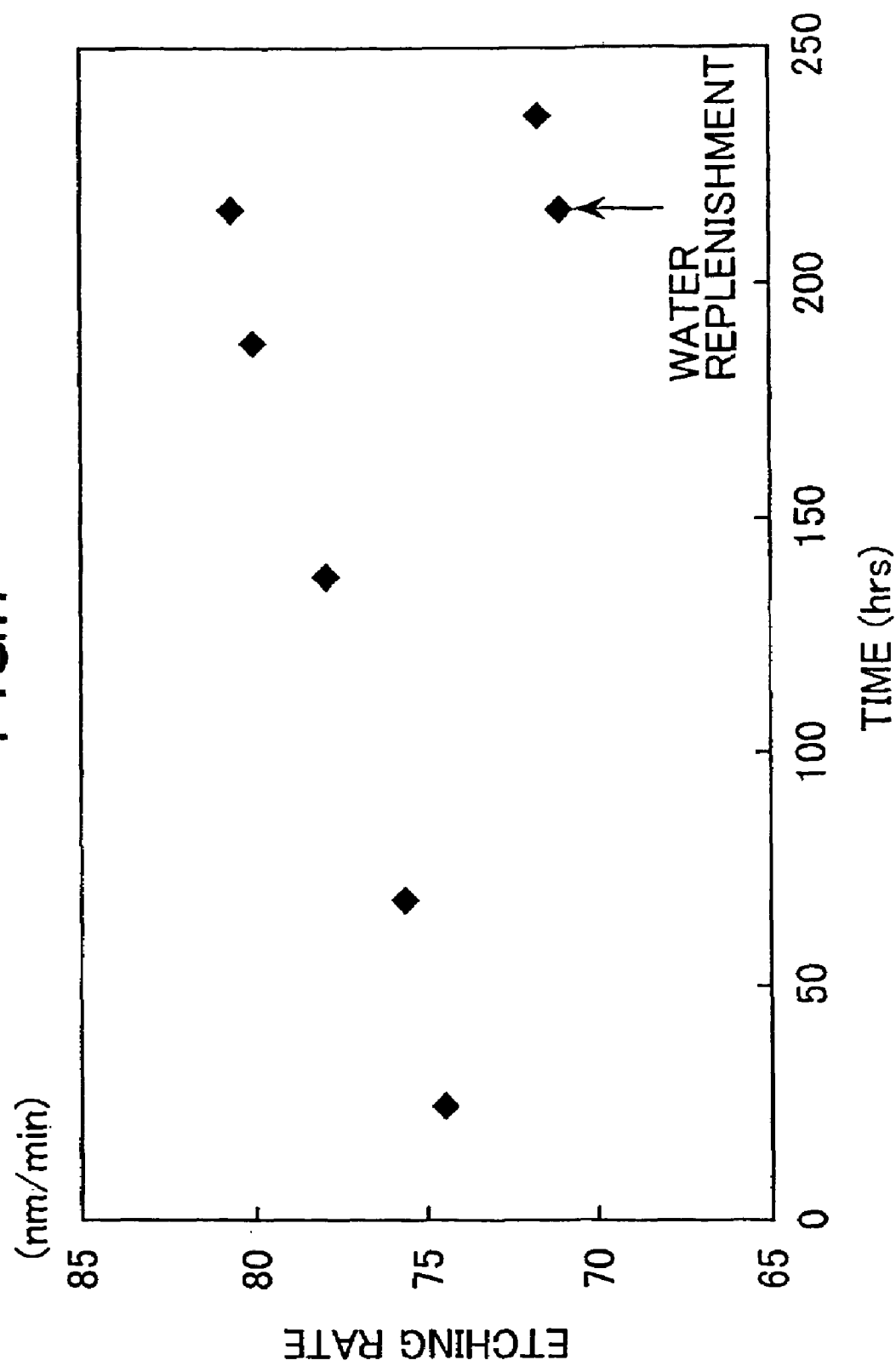
FIG. 7 is a graph showing the change in the etching rate by addition of water according to the present invention.

FIG. 7 is a graph showing the state of controlling the etching rate and HF concentration by addition of water.

The time is taken as the abscissa and represented by a unit of "hours (hrs)", and ranges from 0 to 250 hours. On the other hand, the etching rate is taken as the ordinate and represented by a unit of "nm/min", and ranges from 65 to 85 nm/min.

After a lapse of 25 hours, the etching rate is 74 nm/min; after a lapse of 70 hours, the etching rate is 76 nm/min; and after a lapse of 220 hours, the etching rate is 82 nm/min. When water is added at a point in time after 220 hours, the etching rate is lowered to about 72 nm/min.

Thus, the etching rate and the HF concentration can be kept in a constant range by intermittently adding water.

Figure 8:
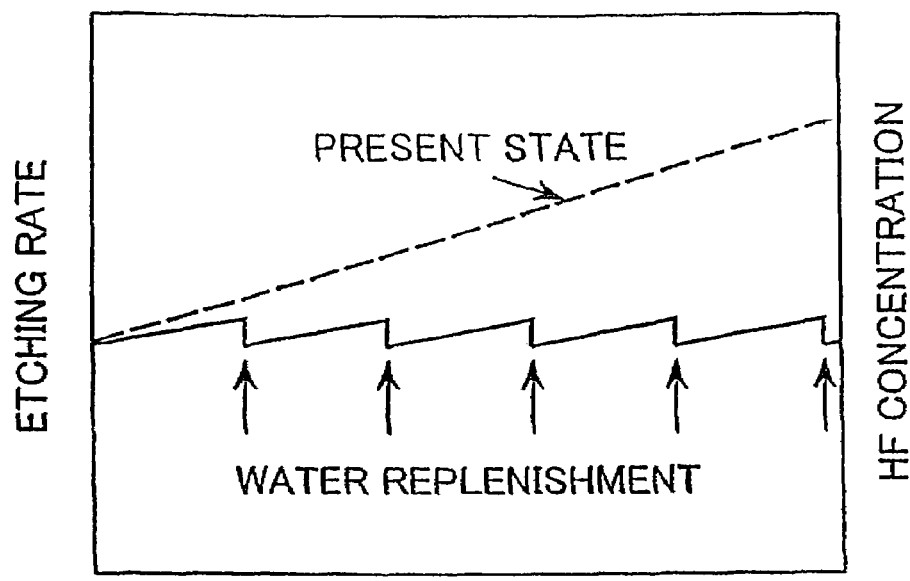
FIG. 8 is a graph showing the state of controlling the etching rate and the HF concentration by addition of water according to the present invention.

A graph showing the relationship between the etching rate and the hydrofluoric acid concentration when water is intermittently added is illustrated in FIG. 8.

FIG. 8 shows an example in which water is intermittently added, but the conditions for water addition may be any of continuous addition and intermittent addition. For keeping the concentration constant, the continuous addition is preferred.

Figure 9:
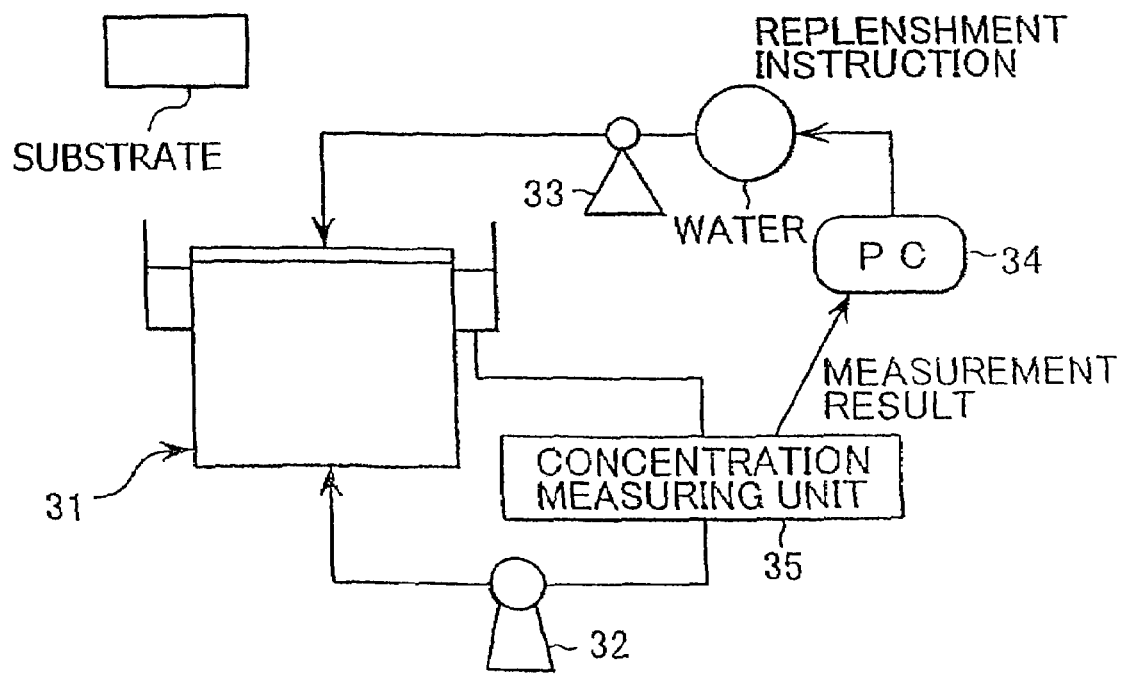
FIG. 9 is a diagrammatic view showing a substrate cleaning apparatus, which is a second embodiment of the present invention.

In the above substrate cleaning apparatus, the timing of the addition of water is controlled based on the measurement data, but, as shown in FIG. 9, a concentration measuring unit 35 can be provided to measure the concentration of the cleaning liquid being circulated, so that the addition of water can be controlled based on the concentration data in real time.

Specifically, the concentrations of the components (e.g., ammonia, hydrofluoric acid, and water) in the cleaning liquid are individually measured by means of the concentration measuring unit 35, and the measurement result is transmitted to a controller 34 comprised of a computer and a central monitoring unit to determine the addition and calculate the required amount of addition, followed by transmission of an instruction for replenishment to a water feeding line (constant delivery pump 33). Then, whether or not the addition is made in accordance with the instruction is confirmed by a measurement by means of the concentration measuring unit 35.

In the present invention, as a method for measuring the concentrations of the components in the cleaning liquid, a measurement of an absorbance at a predetermined wavelength, an infrared absorption spectrum, an ultraviolet absorption spectrum, an index of refraction, a specific gravity, a transmittance, or an electric conductivity may be performed and a measuring unit, such as a Karl Fischer moisture titrator or liquid (ion) chromatography may be used.

Figure 10:
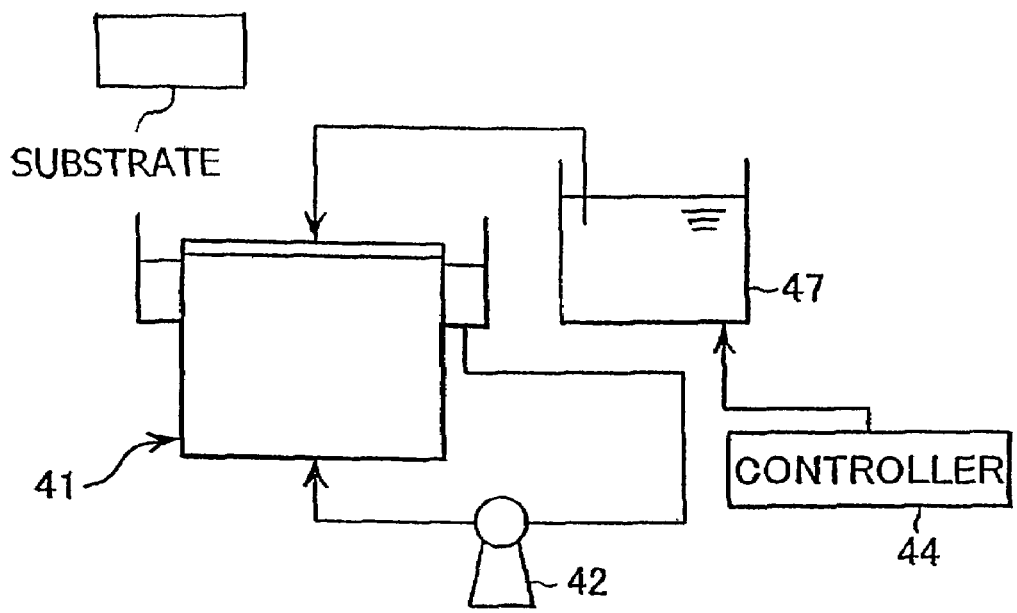
FIG. 10 is a diagrammatic view showing an example of a substrate cleaning apparatus in which an aqueous ammonia storage tank is provided, which is a third embodiment of the present invention.
Figure 11:
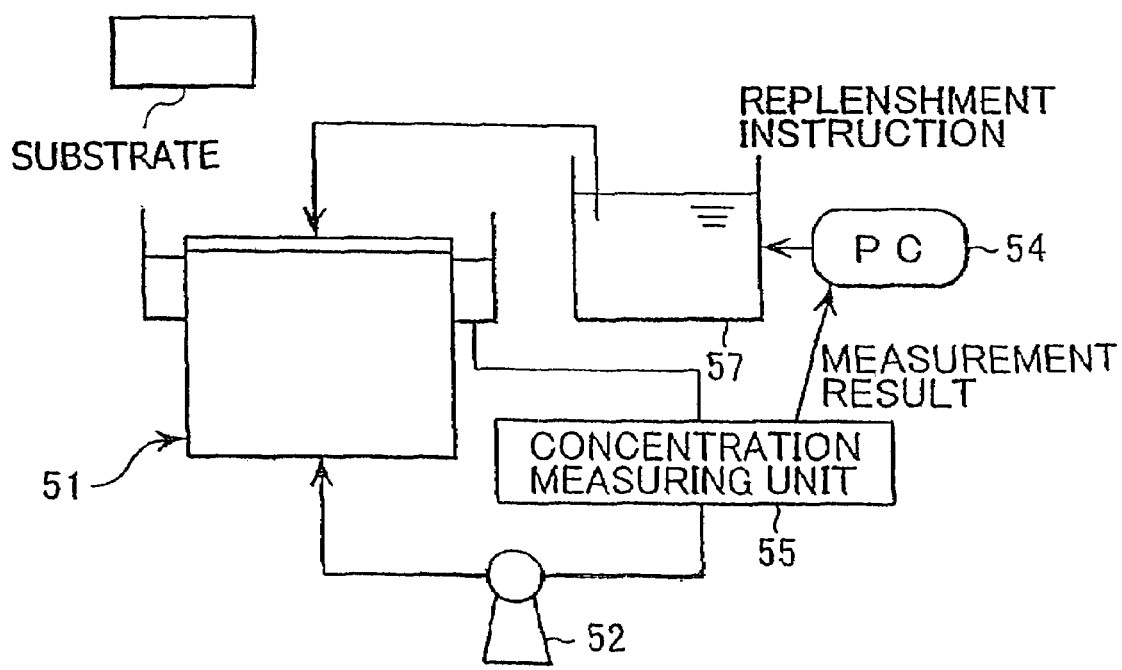
FIG. 11 is a diagrammatic view showing an example of a substrate cleaning apparatus in which an aqueous ammonia storage tank is provided, which is a fourth embodiment of the present invention.

FIG. 10 and FIG. 11 show an example in which an aqueous ammonia storage tank 47 or 57 for feeding aqueous ammonia is provided instead of the constant delivery pump 23 or 33 for feeding water in FIG. 5 and FIG. 9, respectively.

By adding aqueous ammonia instead of water, the HF concentration is effectively controlled, so that the etching rate is controlled to be kept constant.

In the feeding of ammonia, not only aqueous ammonia but also other appropriate aqueous solutions can be used, and further, ammonia gas can also be used. Alternatively, an aqueous solution of ammonium fluoride can be used, and ammonium fluoride can be used in combination with ammonia.

As mentioned above, by adding to the cleaning liquid water, aqueous ammonia, or an aqueous solution of ammonium fluoride in consideration of the etching rate and the individual component concentrations of the cleaning liquid at a certain point in time in the treatment, the etching treatment by the cleaning liquid can be conducted uniformly and stably (namely, the etching rate for an oxide film can be kept constant), so that there is no need to frequently replace the cleaning liquid, which differs from the conventional cleaning. Therefore, the lifetime of the cleaning liquid can be prolonged, and the reduction in frequency of the liquid replacement contributes to a reduction in the cleaning liquid consumed (resource saving) and a reduction in the waste water treatment agent required for the waste water treatment of the cleaning liquid (resource saving). Further, the reduction in these chemicals used contributes to a reduction in the amount of sludge and waste water produced upon the waste water treatment (reduction in the amount of waste).

Thus, the present invention not only achieves the uniform and stable substrate treatment but also contributes to resource saving and the reduction in the amount of waste, namely, preservation of the environment.

As mentioned above, by using the method and apparatus of the present invention, in the cleaning of a substrate using an aqueous solution of ammonium fluoride or a mixture of an aqueous solution of ammonium fluoride and hydrofluoric acid, not only can the treatment be conducted uniformly and stably, but also the frequency of replacement of the cleaning liquid can be reduced, thus making it possible to achieve the saving of resource, i.e., chemicals (a cleaning liquid and a waste water treatment agent), and considerably reduce the amount of sludge and waste water produced upon the treatment.

Although the invention has been described in its preferred form with a certain degree of particularity, obviously many changes and variations are possible therein. It is therefore to be understood that the present invention may be practiced otherwise than as specifically described herein without departing from the scope and the sprit thereof.

What is claimed is:

1. A method for cleaning a substrate including a thermal oxide film of silicon oxide comprising:
    dipping the substrate in a cleaning fluid comprising a mixture of an aqueous solution of ammonium flouride and hydrofluoric acid and having an $NH_4F$ (40%):HF (50%) ratio of about 400:1 to at least partially remove the thermal oxide film from the substrate;
    measuring a characteristic of said cleaning fluid; and
    adding a replenishing liquid comprising at least one fluid selected from a group of fluids consisting of ammonia and aqueous ammonia to the cleaning fluid intermittently during the dipping step in a kind and an amount based on a result of said measuring step so that an $NH_4F(40\%):HF(50\%)$ ratio of the cleaning fluid is maintained at about 400:1.

2. The substrate cleaning method according to claim 1, wherein the measuring step includes measuring said cleaning fluid characteristic at a predetermined time interim during the dipping step.

3. The substrate cleaning method according to claim 1, wherein said characteristic of said cleaning fluid is measured by taking at least one measurement selected from the group consisting of measurements or an absorbance at a predetermined wavelength, an infrared absorption spectrum, an ultraviolet absorption spectrum, an index of refraction, a specific gravity, a transmittance, and an electric conductivity, a measurement by means of a moisture titrator, and a measurement by means of liquid (ion) chromatography.

4. The substrate cleaning method according to claim 2, wherein said characteristic of said cleaning fluid is measured by taking at least one measurement selected from the group consisting of measurements of an absorbance at a predetermined wavelength, an infrared absorption spectrum, an ultraviolet absorption spectrum, an index of refraction, a specific gravity, a transmittance, and an electric conductivity, a measurement by means of a moisture titrator and a measurement by means of liquid (ion) chromatography.

5. The substrate cleaning method according to claim 1, further including:
    determining an optimal amount of water to be added to the cleaning fluid during the dipping step based on a result of said measuring step;
    wherein said adding step includes adding water in the optimal amount to the cleaning fluid to replace evaporated water.

6. The substrate cleaning method according to claim 1, further including:
    determining an optimal timing for adding water to the cleaning fluid during the dipping step based on a result of said measuring step;
    wherein said adding step includes adding water to the cleaning fluid according to said optimal timing to replace evaporated water.

7. The substrate cleaning method according to claim 1, wherein said adding step includes adding ammonia gas to the cleaning fluid during the dipping step.

8. The substrate cleaning method according to claim 1, wherein said cleaning fluid includes multiple components and said measuring step includes measuring concentrations of multiple components of the cleaning fluid individually.

* * * * *